United States Patent
Deak et al.

(10) Patent No.: US 9,182,457 B2
(45) Date of Patent: Nov. 10, 2015

(54) ISOLATED VOLTAGE TRANSDUCER

(75) Inventors: James G. Deak, Jiangsu (CN); Insik Jin, Jiangsu (CN); Xiaofeng Lei, Jiangsu (CN); Weifeng Shen, Jiangsu (CN); Songsheng Xue, Jiangsu (CN)

(73) Assignee: MultiDimension Technology Co., Ltd, Jiangsu (CN)

(*) Notice: Subject to any disclaimer, the term of this patent is extended or adjusted under 35 U.S.C. 154(b) by 88 days.

(21) Appl. No.: 13/882,111

(22) PCT Filed: Oct. 26, 2011

(86) PCT No.: PCT/CN2011/081353
§ 371 (c)(1),
(2), (4) Date: Jun. 20, 2013

(87) PCT Pub. No.: WO2012/055357
PCT Pub. Date: May 3, 2012

(65) Prior Publication Data
US 2013/0271125 A1 Oct. 17, 2013

(30) Foreign Application Priority Data

Oct. 26, 2010 (CN) .......................... 2010 1 0518893

(51) Int. Cl.
*G01R 33/09* (2006.01)
*G01R 31/02* (2006.01)
*G01R 15/14* (2006.01)

(52) U.S. Cl.
CPC .............. *G01R 33/09* (2013.01); *G01R 15/148* (2013.01); *G01R 31/025* (2013.01); *G01R 33/098* (2013.01)

(58) Field of Classification Search
CPC .............................. G01R 33/09; G01R 33/093
USPC ...................... 324/252, 107, 244, 248, 117 H
See application file for complete search history.

(56) References Cited

U.S. PATENT DOCUMENTS

| | | | |
|---|---|---|---|
| 5,489,846 A * | 2/1996 | Li et al. .......................... | 324/252 |
| 2003/0151406 A1* | 8/2003 | Wan et al. ...................... | 324/252 |
| 2008/0112214 A1* | 5/2008 | Chung et al. .................. | 365/158 |
| 2010/0026289 A1* | 2/2010 | Taylor et al. .................. | 324/252 |

* cited by examiner

Primary Examiner — Arleen M Vazquez
Assistant Examiner — Brent J Andrews
(74) Attorney, Agent, or Firm — Stites & Harbison PLLC; Cong Ding

(57) ABSTRACT

A transducer is disclosed for detecting the AC and DC voltage difference between two nodes in an electrical circuit and electronically transmitting the measured voltage difference to an electrical system that is electrically isolated from the common mode potential of the two nodes. The voltage drop between two points in a circuit under test is determined by detecting the current flowing through a resistive shunt coil connected in parallel to the test points. Current through the resistive shunt coil is linearly proportional to the voltage difference between the test points, and it is detected by using a magnetic sensor that is separated from the shunt coil by an insulating dielectric barrier. The transducer can be packaged in a standard integrated circuit package in order to provide a small and low cost voltage transducer for test, measurement, control, and signal-isolation applications.

12 Claims, 7 Drawing Sheets

ISOLATED VOLTAGE TRANSDUCER

FIELD OF THE INVENTION

The present invention relates to an isolated analog voltage transducer utilizing magnetic tunnel junction (MTJ) devices, more specifically relates to a voltage transducer for measuring the voltage difference between the test points by using magnetic tunnel junction (MTJ) devices to measure the current flowing through a resistive shunt coil connected to the test points.

BACKGROUND OF THE INVENTION

Voltage measurements are an important part of industrial, consumer electronics, and medical electronics applications. Often these applications involve environments with hazardous voltages, transient signals, common-mode voltages, and fluctuating ground potentials capable of damaging electronic systems and in an extreme case, causing physical harm to a person in contact with the electronic device. To overcome these issues, electronic test, measurement, and control systems are often designed to isolate the measurement test points from the data acquisition electronics through the use of an isolation barrier.

Electrical isolation schemes usually provide separate ground planes for an analog front end and the system backend to eliminate the influence from the common mode input signal offset in the front end from the backend of the system. The front end is often a floating ground that can operate at a different potential than the back end system.

Common techniques for isolating a common mode voltage from an electronic system include inductive, capacitive, and optical coupling. Transformers and capacitors are perhaps the most commonly used approaches for inductive and capacitive coupling, respectively. Without the use of an encoding technique, such as a voltage to frequency converter on the input side of the circuit, capacitor and transformer based techniques are limited to AC signals. Transformers are relatively expensive and difficult to build into an integrated circuit while maintaining high sensitivity and low frequency performance. Capacitors are easily integrated into an integrated circuit package, but for all but high frequency signals, capacitive techniques require an active front end encoder to encode the signal to be passed to the output. The active front-end circuitry is also sensitive to voltage transients, which may not be compatible with systems that are subject to voltage or current transients. Optical isolators are relatively expensive compared to capacitive techniques. They are also limited to relatively low power applications.

Magnetic analog signal isolation devices are uncommon, but in principle would include a coil to generate a magnetic field and a magnetic field sensor to detect the magnetic field. Because magnetic sensors detect absolute field amplitude, rather than the rate of change of the magnetic field, sensitivity is not degraded at low frequency. Thus with a high sensitivity and high resolution magnetic field sensor, the input coil need not have many turns and could thus be rather small. In addition provided the magnetic sensors were amenable to production using standard semiconductor fabrication equipment, it would be relatively easy to integrate the entire magnetic isolation device into a small, inexpensive, monolithic semiconductor chip.

There are various means by which the magnetic signal could be detected, and of these, there are many magnetic sensing technologies that can be integrated into a semiconductor chip. These include Hall Effect Sensors and magnetoresistive sensors including anisotropic magnetoresistance (AMR) and giant magnetoresistance (GMR). Hall Effect devices are comparatively expensive and lacking in resolution. AMR and GMR devices although they are relatively high-resolution devices, suffer from low signal amplitude that makes the back-end circuit design relatively complicated, which increases system complexity and size and therefore increases cost.

MTJ magnetic sensors, which are small and detect magnetic field through the use of the tunneling magnetoresistance (TMR) effect, offer high resolution and large signal amplitude. These features can be used to simplify the back end electronic system design, thereby lowering total system cost.

SUMMARY OF THE INVENTION

To overcome the above defects of the prior art, an isolated voltage transducer is provided which is electrically isolated from the measured circuit, has digital output high precision, and high resolution.

One aspect of the present invention is to provide a single-package isolated voltage transducer that is mainly used to measure the voltage difference between two nodes in circuit, which comprises:

an internal resistor and voltage shunt coil that are connected in series between the input pins of the isolated voltage transducer;

a magnetic sensor disposed proximate and magnetically coupled to the voltage shunt coil, which is used for detecting the current flowing in the voltage shunt coil, and providing a response to the current flowing in the voltage shunt coil and outputting a voltage signal that represents the differential voltage difference between the input pins of the isolated voltage transducer;

a sampling module for sampling the voltage signal and converting the voltage signal into a digital form;

a processing module for processing the sampled data;

an interface logic module for transforming the processed data into a format that is compatible with an off-chip system.

Preferably, the magnetic sensor can be comprised of MTJ devices.

Preferably, the magnetic sensor, the sampling module, the processing module, and the interface logic module are electrically and physically isolated from the input signal and voltage shunt coil, and the galvanic isolation is accomplished through the use of magnetic coupling and insulating dielectric layers.

Preferably, the magnetic sensor is comprised of at least one MTJ devices.

Preferably, the magnetic sensor has a characteristic bias response curve for controlling the magnitude of the sensor response.

Preferably, at least one of the magnetic sensors has an on-chip electromagnet used to improve the linearity of the sensor response.

The other aspect of the present invention is to provide a single-package isolated voltage transducer for isolating an analog input signal from an analog output signal, which comprises:

an internal resistance and voltage shunt coil that is connected in series between the input pins of the isolated voltage transducer;

a magnetic sensor disposed proximate and magnetically coupled to the voltage shunt coil, which is used for detecting the current flowing in the voltage shunt coil, and providing a response to the current flowing in the voltage shunt coil and outputting a voltage signal that represents the differential voltage difference between the input pins of the isolated voltage transducer.

Preferably, the magnetic sensor can be comprised of MTJ devices.

Preferably, the magnetic sensor is electrically and physically isolated from the input signal and voltage shunt coil, and the galvanic isolation is accomplished through the use of magnetic coupling and insulating dielectric layers.

Preferably, the magnetic sensor is comprised of at least one MTJ devices.

Preferably, the magnetic sensor has a characteristic bias response curve for controlling the magnitude of the sensor response.

Preferably, at least one of the magnetic sensors has an on-chip electromagnet used to improve the linearity of the sensor response.

According to the technical solution provided by the present invention, the transducer is electrically isolated from the measured test points. It measures the voltage between the test points by detecting the current flowing through a resistive shunt coil connected to the test points in parallel. It measures the current in the coil by using the magnetic sensor that is isolated from the resistive shunt coil by using an insulating dielectric, so the voltage between test points is proportional to the current flowing through a resistive shunt coil. Additionally, the voltage transducer adjusts the measurement range automatically by controlling the bias voltage of magnetic sensor, and it can compute the needed electrical circuit parameters such as frequency, peak voltage, RMS (Root Mean Square) voltage, transient voltage. The voltage transducer can also provide various measurement parameters needed by the application, and it has the capability to communicate the computed parameters through a digital communication module that is electrically isolated from the power supply. This capability further simplifies voltage measurement system designs and reduces the total cost as it eliminates the need to isolate and convert the data form of the discrete analog signal.

The above voltage transducer uses MTJ devices as the magnetic sensitive elements. The output of MTJ devices is proportional to the bias voltage applied on MTJ devices. The bias voltage of MTJ devices is used to automatically scale the sensor output.

Additionally, the MTJ devices utilize an on-chip electromagnet to linearize the response of MTJ sensor.

As compared the prior art, the present invention has the following beneficial effects:

The present invention measures the voltage across the load using a magnetic method. Because the measurement of magnetic field is electrically isolated from the load working circuits, there is no direct electrical connection between the integrated chips used in measurement and the data acquisition network. Therefore the key electronic devices are isolated from the power supply, which greatly enhances endurance of the measuring system to the transients produced by power supply transients.

The voltage transducer with digital output described in the present invention has the capability to compute the electrical circuit parameters such as peak voltage, RMS (Root Mean Square) voltage, DC voltage, and frequency. These parameters may be used in electric energy measurement. The voltage transducer can provide various parameters needed by an application, and has the capability to communicate the computed circuit parameters on a digital communication system that is electrically isolated from the power supply. This capability further simplifies voltage measurement system designs and reduces the total cost as it eliminates the need of the subsequent systems to be isolated electrically and convert the data form of the discrete analog signal.

Because of these features, the disclosed voltage transducer has lower total cost, and high stability. Additionally, MTJ sensors provide the device with high sensitivity, high resolution, and simplified front end circuitry that is convenient to connect with the subsequent circuit.

DETAILED DESCRIPTION

Figure 1:
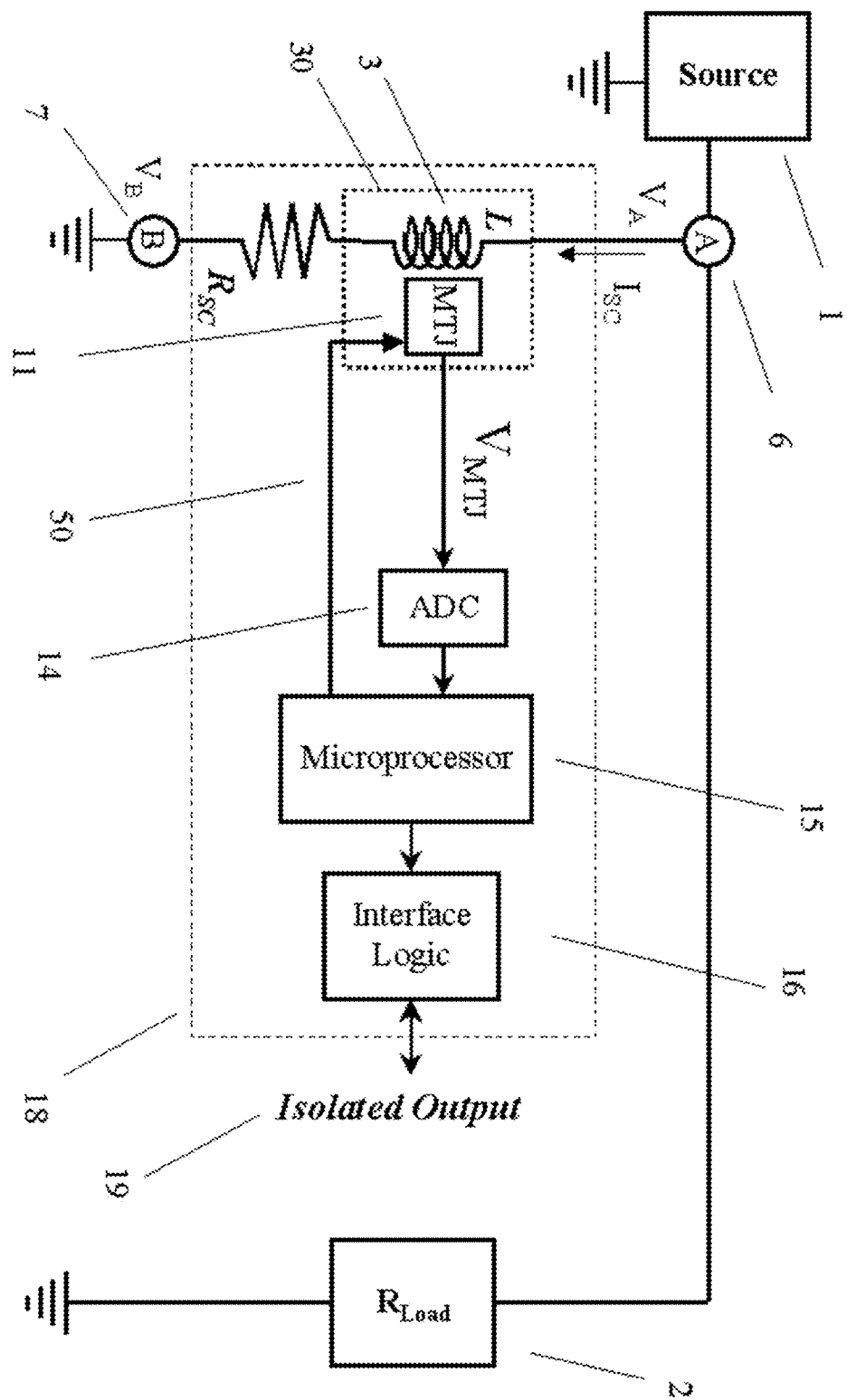
FIG. 1 is a schematic drawing showing a fully integrated voltage transducer with isolated digital output using a MTJ sensor and resistive shunt coil to measure voltage in a circuit between points A and B.

The single-package, galvanically isolated, voltage transducer of the present invention is shown generally as 18 in the Figures. Referring to FIG. 1, the input connections 6, 7 of voltage transducer 18 are connected to test points A and B associated with a power source 1, and load 2, in order to measure the differential voltage between points A and B. A shunt coil 3 within the voltage transducer 18 is connected in series to a resistor Rsc within the isolated voltage transducer 18. One end of the shunt coil 3 is connected to input 6 and one end of the resistor Rsc is connected to input 7. The voltage difference between A and B causes a current to flow through the shunt coil 3. The current flowing through the shunt coil, $I_{SC}$ generally has a magnitude of $$I_{SC} = (V_A - V_B)/Rsc = \Delta V/Rsc \quad [\text{EQ1}]$$

Current $I_{SC}$ produces a magnetic field H, as it flows through the shunt coil 3.

The MTJ device 11 is magnetically coupled to the shunt coil 3. It is the object of the MTJ sensor 11 to detect H produced by $I_{SC}$ in order to determine the voltage drop between points A and B in the test circuit.

$$\Delta V = (V_A - V_B), \quad [\text{EQ2}]$$

The MTJ device 11 is sensitive to the magnetic field H caused by current $I_{SC}$ flowing in the shunt coil 3.

For voltage measurement applications, the resistance Rsc within voltage transducer 18 must be much larger than the equivalent resistance of the circuit under test, $R_{load}$ 2. In applications such as residential power metering, the resistance of load 2 is generally less than 100Ω. The upper limit of the resistance Rsc depends on the required resolution, and the lower limit of the resistance Rsc depends on the equivalent resistance of the circuit to be tested. In practical application, the Rsc shall be at least 100 times of the resistance of load 2. In a home application, this would set the minimum resistance at >10 kΩ.

In response to the current flow in shunt coil 3, the MTJ device 11 outputs a voltage $V_{MTJ}$, that is proportional to ΔV across the input connections 6, 7 of the voltage transducer 18. The time dependent $V_{MTJ}$ signal is supplied to the microprocessor 15 in a digitized form in order to permit computation of circuit parameters including but not limited to instantaneous voltage, RMS voltage, peak voltage, DC voltage, and frequency.

There are various means by which $V_{MTJ}$, representing voltage across the voltage transducer input connections 6, 7 across the MTJ device 11, can be communicated to the microprocessor 15. Generally, $V_{MTJ}$ must be sampled and digitized prior to passing it to the microprocessor 15, which requires the use of an analog to digital converter (ADC) 14. The ADC 14, must sample the voltage a minimum of twice per cycle of the highest frequency harmonic of the input signal.

Accurate computation of the desired parameters by microprocessor 15 relies on properly scaling $V_{MTJ}$ provided by the MTJ sensors 11. The scale factor for each waveform will be implementation dependent and also dependent on the specific characteristics of the sensors.

In order to simplify the isolated voltage transducer's 18 design and improve accuracy, the MTJ magnetic sensors' 11 outputs may be adjusted to keep them within the optimal range of the ADC's 14 input. Two methods for controlling the response of MTJ magnetic sensors are easily applied. One method, illustrated in FIG. 2, involves controlling the bias voltage of the MTJ device. The other method, illustrated in FIG. 3, utilizes the closed loop operation of an MTJ to compensate the field supplied to the sensor by the power conductor or the voltage shunt coil 3.

Figure 2:
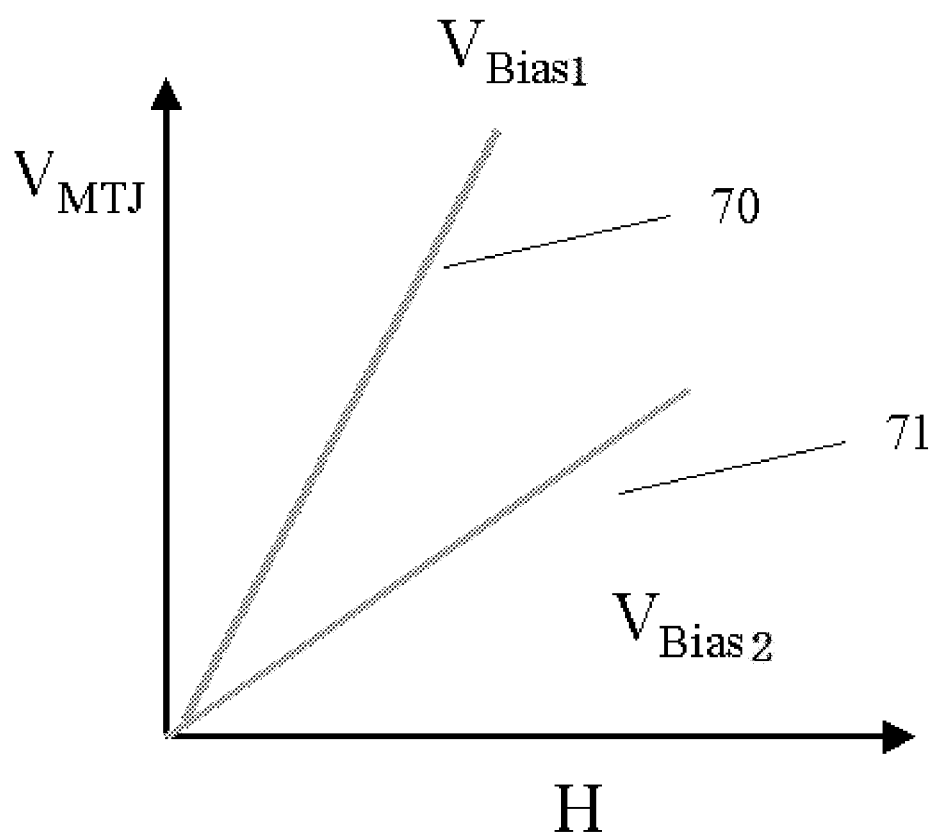
FIG. 2 shows the response curve of MTJ devices as a function of bias voltage that can be used to control the magnitude of the output signal.

FIG. 2 shows an exemplary magnetic field sensitivity response curve as a function of bias voltage applied to a MTJ sensor. To the bigger bias voltage $V_{Bias1}$, its response curve is shown as 70, and to the smaller bias voltage $V_{Bias2}$, its response curve is shown as 71. At small magnetic fields, the sensor provides an output linearly proportional to the applied field H. As the bias voltage of the sensor is changed, the slope of the output curve $\beta(V_{Bias})=V_{MTJ}/H_{SC}$ is changed. Provided the response curve $\beta(V_{Bias})$ is known, $V_{Bias}$ may be varied in order to maximize the signal-to-noise ratio (SNR) of the ADC 14. This may be accomplished by using the microprocessor 15 to compute the optimal $V_{Bias}$ for the sensors, and the voltages may be fed back to the MTJ devices through wire 50 in FIG. 1. The microprocessor 15 would then scale the waveform as follows:

$$\Delta V = \frac{R_{SC}}{\alpha_{SC}\beta(V_{Bias})} V_{MTJ} \quad [EQ3]$$

Here $\alpha_{SC}=H_{SC}/I_{SC}$ is a constant that depends on the geometry of shunt coil 3.

Figure 3:
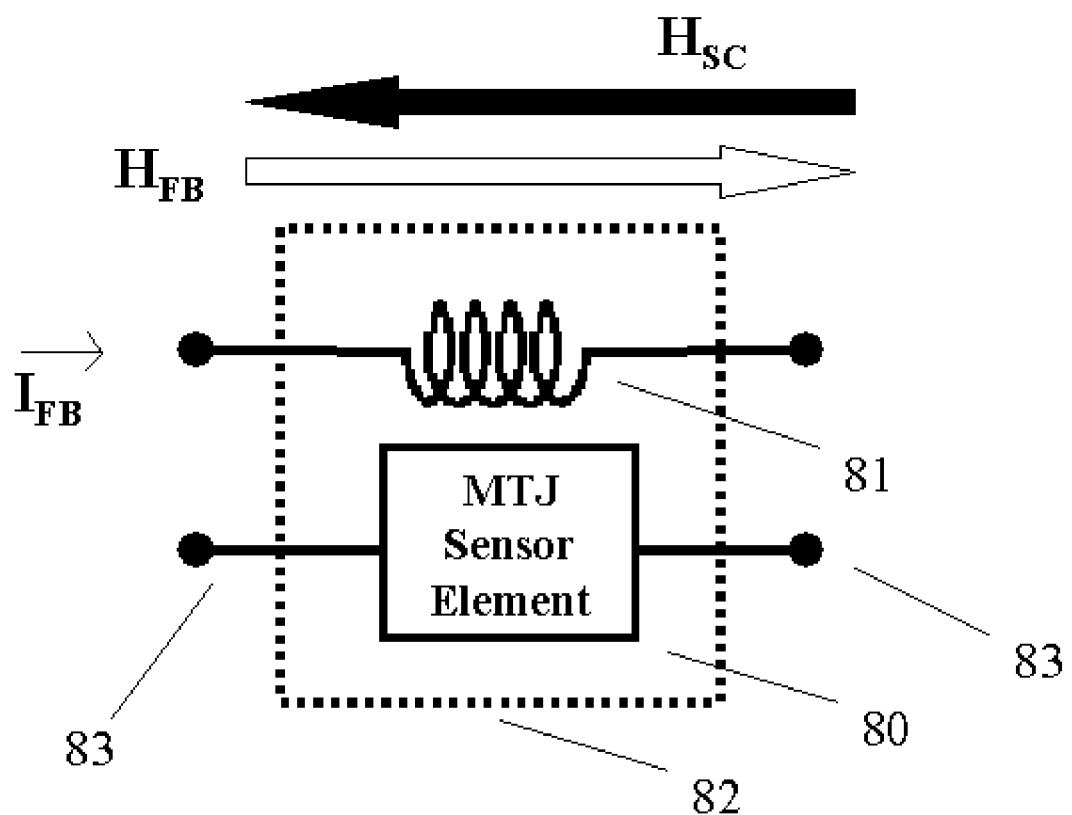
FIG. 3 is a schematic drawing showing a MTJ device using an on-chip electromagnet to control the magnitude of the output signal.

FIG. 3 shows an exemplary method for improving the linearity of magnetic field sensors, in which the sensors are supplied with a compensating magnetic field $H_{FB}$ 85 that is in opposition to the field being measured. This is often referred as the closed loop system 82. In this closed loop method, a magnetic field $H_{FB}$ 85, in opposition to the shunt coil field, $H_{SC}$ 84, is supplied by the on-chip electromagnet 81. In the closed loop mode, the output of MTJ sensor 80, $V_{MTJ}$ 83 is held constant by varying the current through the electromagnet 81. Because the feedback current $I_{FB}$ 86 through the electromagnet 81 is proportional to the compensating magnetic field $H_{FB}$ 85, and $H_{FB}$ 85 is equal to the magnetic field being measured $H_{SC}$ 84, the current $I_{FB}$ 86 flowing through the electromagnet 81 is directly proportional to the voltage difference ΔV between points A and B. If the calibration for the electromagnet 81 is given as $\alpha_{FB}=H_{FB}/I_{FB}$, then the ΔV is given as follows:

$$\Delta V = \frac{\alpha_{SC} R_{SC}}{\alpha_{SC}} I_{FB} \quad [EQ4]$$

The microprocessor 15 is easily designed to provide the appropriate calibration parameters as well as to control the bias voltage or feedback current necessary to keep the MTJ device outputs within the range of the ADC's 14 optimal response, without the use of variable gain preamplifiers.

The voltage transducer 18 is intended to provide a digital signal to communicate the measured parameters with an external system that might comprise a data-logger, a microprocessor, or other electronic system for use in power metering applications. In order to do so, the quantities computed by the microprocessor 15 must be converted into a data format that is compatible with the off-chip external system. The voltage transducer thus includes an interface logic circuit 16 to convert the data into one of various formats including but not limited to one of the following standards, USB, RS-232, $I^2C$, or SPI, and finally output the data through isolated output 19.

Figure 4:
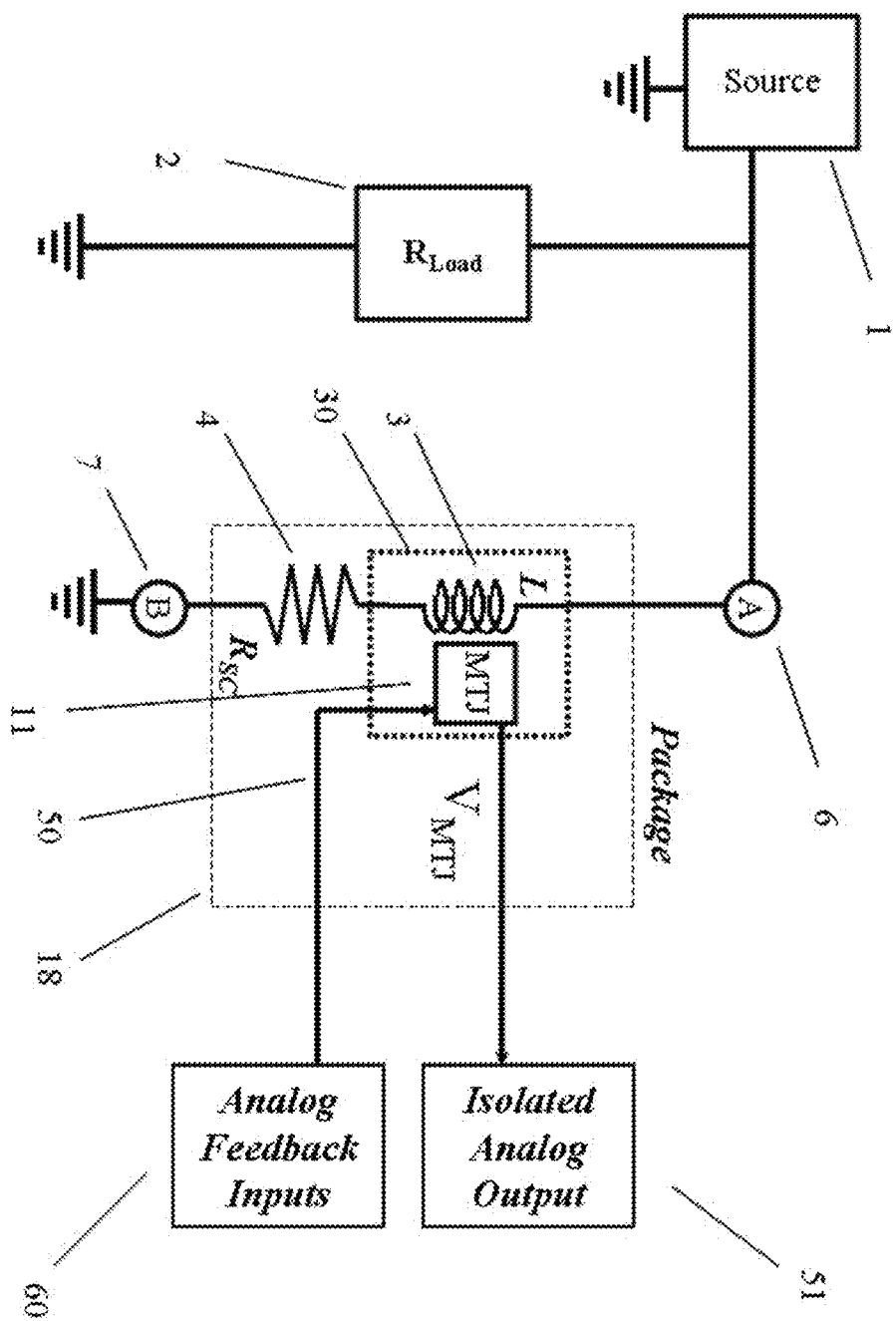
FIG. 4 is a schematic drawing showing a fully integrated isolated voltage transducer with isolated analog output using a MTJ sensor and resistive shunt coil to measure voltage in a circuit between points A and B.

FIG. 4 shows an alternative arrangement of the voltage transducer 18 as an analog voltage signal isolator. Referring to FIG. 4, the input connections 6, 7 of voltage transducer 18 are connected to test points A and B associated with a power source 1 and load 2, in order to measure the differential voltage between points A and B. A shunt coil 3 within voltage transducer 18 is connected in series to a resistor Rsc within the isolated voltage transducer 18. One end of the shunt coil 3 is connected to input 6, and one end of the internal resistor Rsc is connected to input 7. The voltage difference between A and B causes a current to flow through the shunt coil 3.

In response to the current flow in the shunt coil 3, the MTJ device 11 outputs a voltage, $V_{MTJ}$ that is proportional to ΔV across the input connections 6, 7 of voltage transducer 18. The time-dependent voltage signal $V_{MTJ}$ is supplied directly to the output of the isolated analog output 40. Because the shunt coil 3 is electrically isolated from the MTJ device 11, the analog signal output of the voltage transducer 18 is electrically isolated from the input signal ΔV. In order to improve the linearity of the MTJ response and automatically adjust the response range of $V_{MTJ}$, an analog input line 65 is provided to supply feedback current or a bias voltage to the MTJ device 11.

Figure 5:
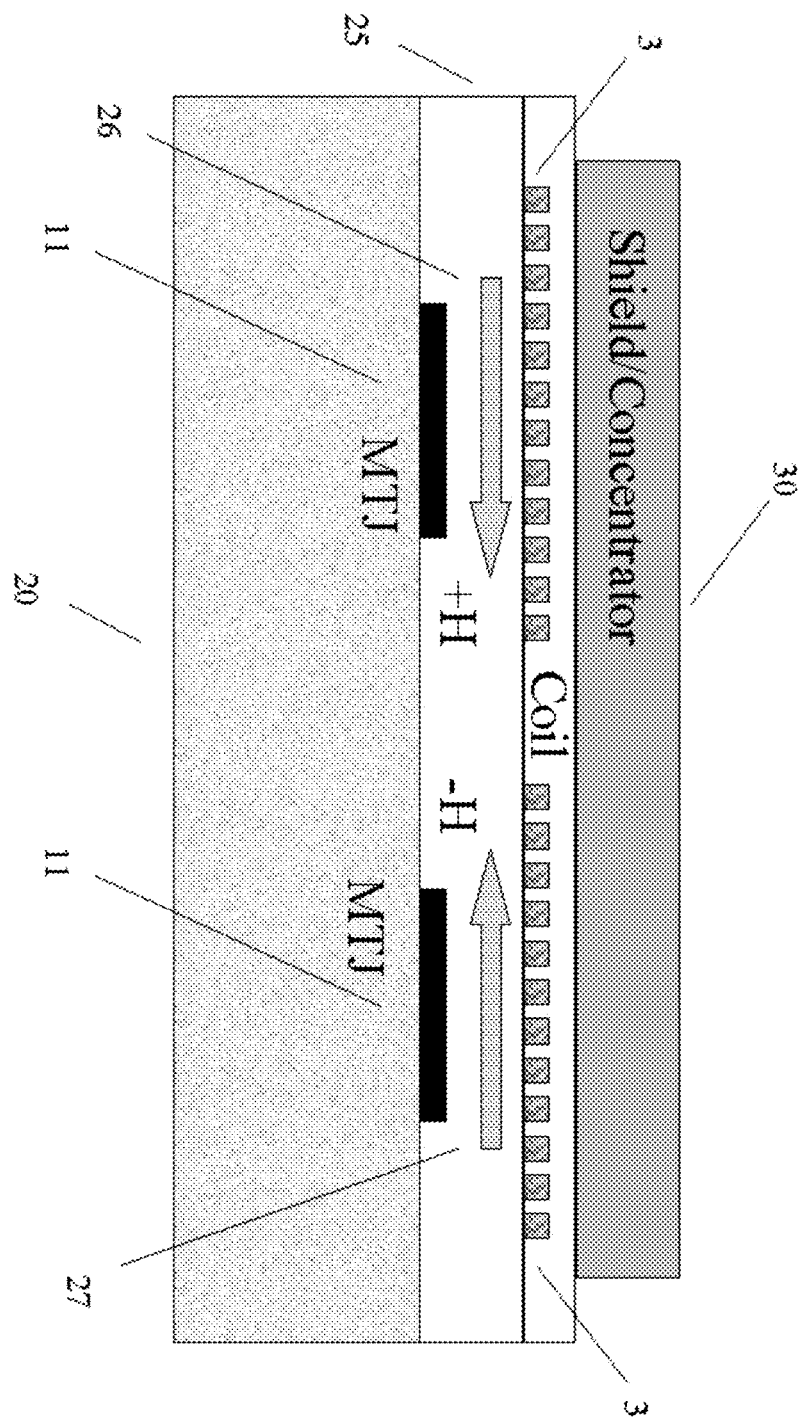
FIG. 5 is a perspective drawing showing a fully integrated voltage transducer chip indicating the location of the MTJ sensors with respect to the resistive coil for push-pull operation.

FIG. 5 shows a perspective drawing of a monolithic isolated voltage transducer integrated circuit. In this case, a minimum of two MTJ sensors 11 are integrated onto a substrate 20. The MTJ sensors are encapsulated in a thick dielectric layer 25, which may comprise any of various insulating dielectric materials including but not limited to polyimide, SU-8, bisbenzocyclobutene (BCB), SiNx, SiOx, or $AL_2O_3$. A wound flat shunt coil 3 is formed on top of the insulating dielectric layer 25. The shunt coil 3 and two MTJ devices 11 are arranged so that the two MTJ devices 11 are driven in opposite directions by the field +H26, −H27 produced by the shunt coil 3. This is often referred to as a push-pull arrangement. The push-pull technique is useful for minimizing the influence of ambient fields in the environment. Various electrical contact pads can be put on top of the insulating dielectric layer 25, and multiple wiring pins 14 can be set correspondingly, the shunt resistor Rsc can be deposited directly on the substrate 20. When integrated in this manner, the monolithic voltage transducer chip may easily be packaged in any of various form factors including but not limited to TSOP, MSOP, DIP, and various chip-scale packaging formats.

Figure 6:
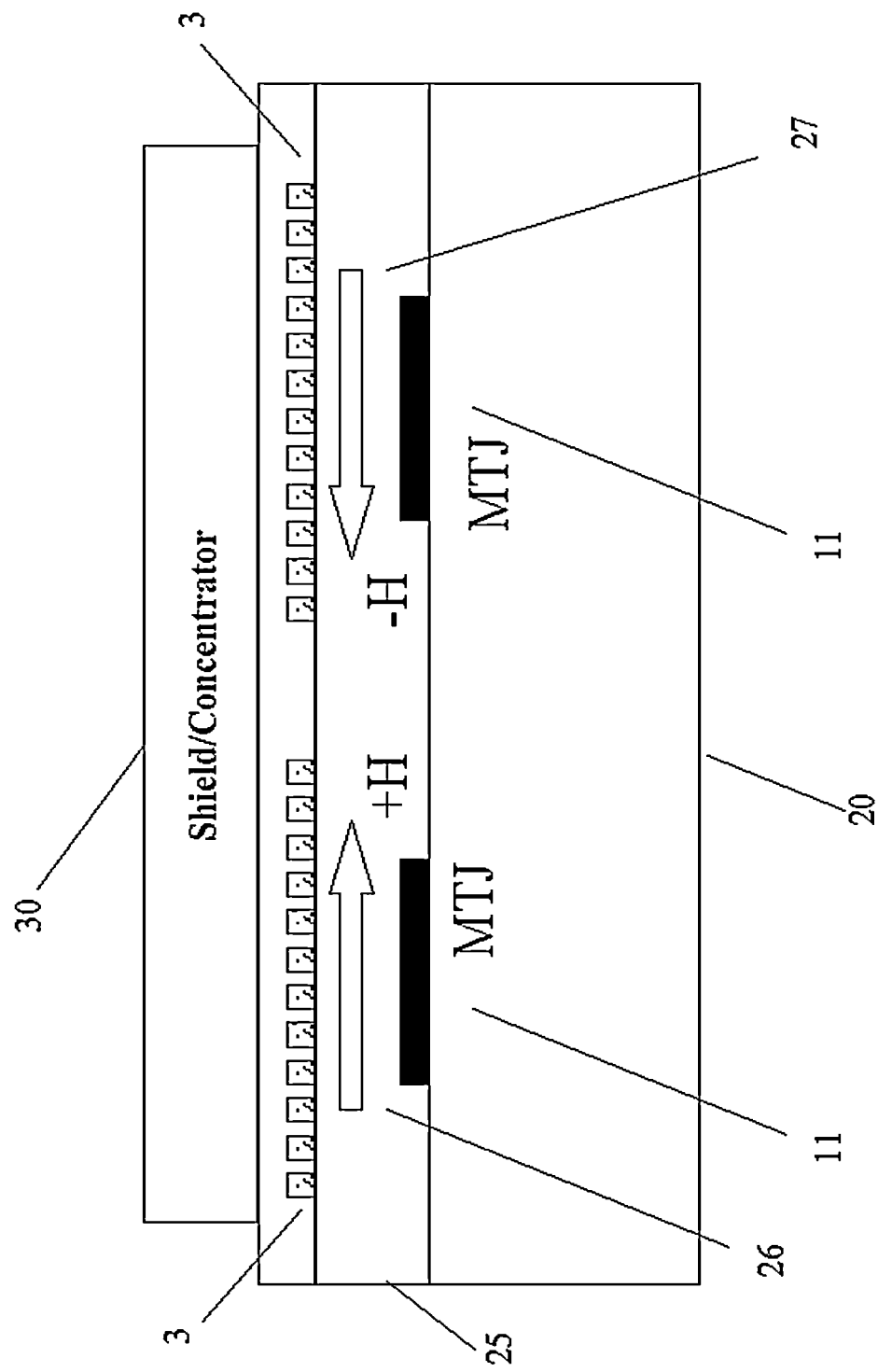
FIG. 6 is a cross-sectional view of a monolithic isolated voltage transducer semiconductor chip.

FIG. 6 shows a cross-sectional view of the monolithic voltage isolator chip. The monolithic voltage isolator chip includes a magnetic shield and/or flux concentrator 30 that performs the dual function of amplifying the magnetic field produced by the shunt coil 3, in addition to shielding the effect of ambient fields from the environment.

Figure 7:
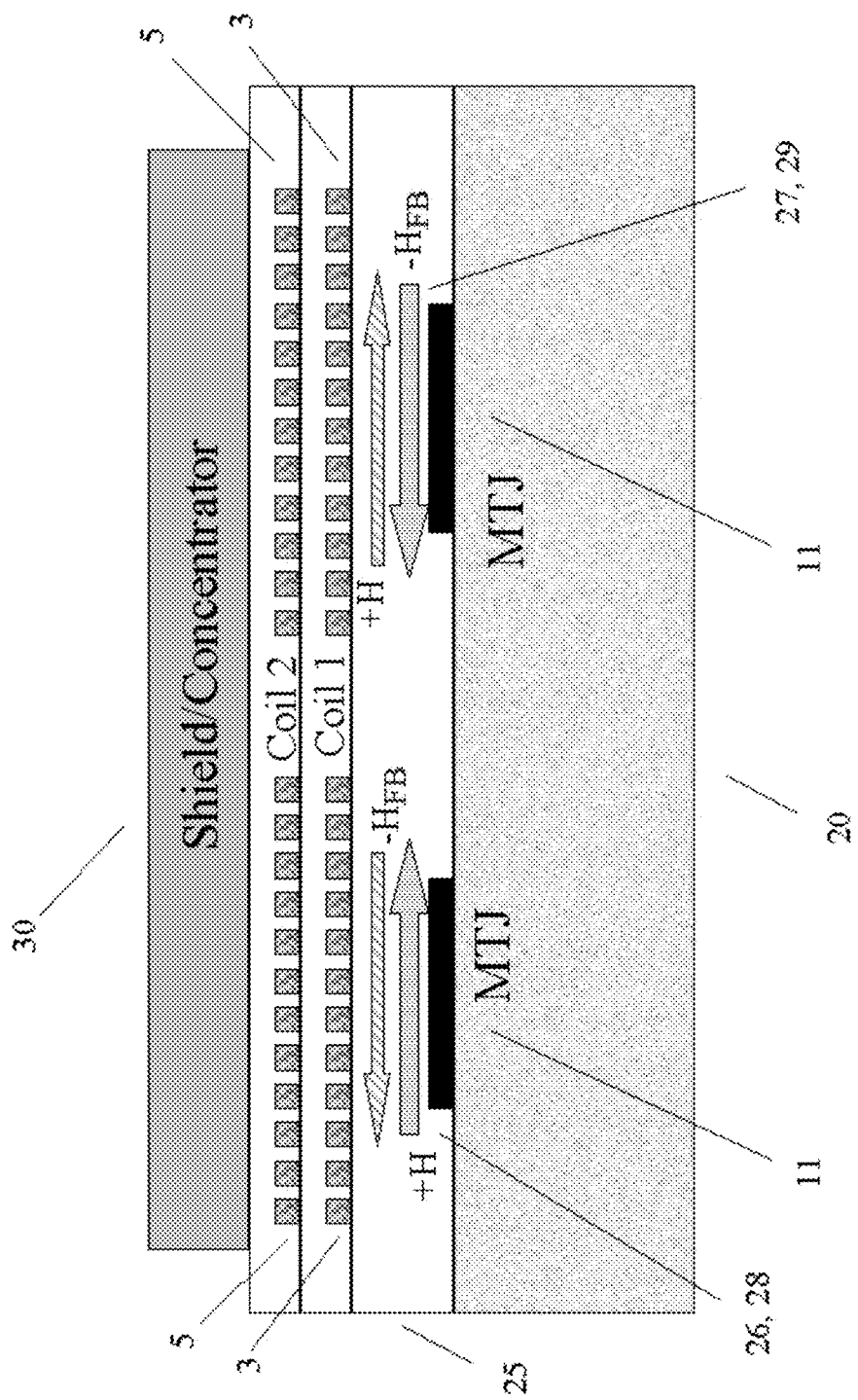
FIG. 7 is a cross-sectional view of a monolithic isolated voltage transducer including a feedback coil.

FIG. 7 shows another embodiment of the monolithic voltage transducer chip that includes a feedback coil 5 that generates feedback magnetic field +HFB29, −HFB27 for use in linearizing and extending the range of the response of the monolithic voltage transducer.

In both monolithic voltage transducer implementations shown in FIGS. 6 and 7, the ADC 14, microprocessor 15, and interface logic 16, all can be integrated into the substrate 20. This is the preferred implementation of a low cost voltage transducer.

The specific embodiments are described hereinbefore with reference to the drawings of the present invention, but the protecting scope of the present invention isn't limited to the above embodiments. Various modifications and variations can be done within the scope of the technical gist with mastering the common knowledge in the technical field of the present invention.

What is claimed is:

1. A single-package isolated voltage transducer (18) for measuring the differential voltage between two nodes in circuit, wherein the isolated voltage transducer (18) comprises:

an internal resistor (Rsc) and a voltage shunt coil (L) that are connected in series between the input pins of the isolated voltage transducer (18), such that the current flowing through the shunt coil is linearly proportional to the voltage difference between the two nodes in the circuit;

a magnetic sensor (11) disposed proximate and magnetically coupled to the voltage shunt coil (L), which is used for detecting current (Isc) flowing in the voltage shunt coil (L), and providing a response to the current flowing in the voltage shunt coil (L) and outputting a voltage signal (VMTJ) that represents the voltage difference between the input pins of the isolated voltage transducer (18);

a sampling module (14) for sampling the analog voltage signal and converting the signal into a digital form;

a processing module (15) for processing the sampled data;

an interface logic module (16) for transforming the processed data into a format that is compatible with an off-chip system.

2. The voltage transducer (18) as claimed in claim 1, wherein the magnetic sensor (11) comprises MTJ devices.

3. The voltage transducer (18) as claimed in claim 1, wherein the magnetic sensor (11), the sampling module (14), the data processing module (15), and the interface logic module (16) are electrically and physically isolated from the input signal and the shunt resistance coil (L), isolation is accomplished through the use of insulating dielectric layers.

4. The voltage transducer (18) as claimed in claim 1, wherein the magnetic sensor comprises at least one MTJ device.

5. The voltage transducer (18) as claimed in claim 4, wherein the magnetic sensor has a bias voltage response characteristic curve for controlling the magnitude of the sensor response.

6. The voltage transducer (18) as claimed in claim 4, wherein at least one of the magnetic sensors has an on-chip electromagnet used to improve the linearity of the sensor response.

7. A single-package isolated voltage transducer (18) for isolating an analog input signal from an analog output signal, wherein the voltage transducer (18) comprises:

an internal resistor (Rsc) and a voltage shunt coil (L) that are connected in series between the input pins of the isolated voltage transducer (18), such that the current flowing through the shunt coil is linearly proportional to the voltage difference between the two nodes in the circuit;

a magnetic sensor (11) disposed proximate and magnetically coupled to the voltage shunt coil (L), which is used for detecting current (Isc) flowing in the voltage shunt coil (L), and providing a response to the current flowing in the voltage shunt coil (L) and outputting a voltage signal (VMTJ) that represents the voltage difference between the input pins of the isolated voltage transducer (18).

8. The voltage transducer (18) as claimed in claim 7, wherein the magnetic sensor (11) comprises MTJ devices.

9. The voltage transducer (18) as claimed in claim 7, wherein the magnetic sensor, is electrically and physically isolated from the input signals and the shunt resistance coil (L), and the isolation is accomplished through the use of insulating dielectric layers.

10. The voltage transducer (18) as claimed in claim 7, wherein the magnetic sensor is comprised of at least one MTJ device.

11. The voltage transducer (18) as claimed in claim 10, wherein the magnetic sensor (11) has a bias voltage response characteristic curve that is used to control the magnitude of the sensor response.

12. The voltage transducer (18) as claimed in claim 10, wherein at least one of the magnetic sensors (11) has an on-chip electromagnet that is used to linearize the sensor response.

* * * * *